United States Patent
Harris et al.

(10) Patent No.: US 7,355,854 B2
(45) Date of Patent: Apr. 8, 2008

(54) APPARATUS FOR IMPROVED GROUNDING OF FLANGE MOUNT FIELD EFFECT TRANSISTORS TO PRINTED WIRING BOARDS

(75) Inventors: Matthew Harris, Rochester, NY (US); Anthony Manicone, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 120 days.

(21) Appl. No.: 11/448,562

(22) Filed: Jun. 7, 2006

(65) Prior Publication Data

US 2007/0285893 A1    Dec. 13, 2007

(51) Int. Cl.
*H05K 7/20* (2006.01)

(52) U.S. Cl. ............ 361/707; 361/704; 361/719; 361/720; 361/761; 165/80.2; 165/80.3; 165/185; 257/707; 257/713; 174/252

(58) Field of Classification Search ............ 361/700, 361/702–710, 712, 690–698, 713, 714, 715, 361/718–723; 257/622, 690, 688, 706–727, 257/734, 785, 786; 174/16.3, 252; 165/80.2, 165/80.3, 104.33, 185
See application file for complete search history.

(56) References Cited

U.S. PATENT DOCUMENTS

| | | | | |
|---|---|---|---|---|
| 4,172,261 A | * | 10/1979 | Tsuzuki et al. | 257/717 |
| 4,612,566 A | * | 9/1986 | Kowata et al. | 257/728 |
| 4,731,693 A | * | 3/1988 | Berg et al. | 361/719 |
| 4,967,258 A | * | 10/1990 | Fithian et al. | 257/533 |
| 5,043,845 A | * | 8/1991 | McDermott et al. | 361/705 |
| 5,825,625 A | * | 10/1998 | Esterberg et al. | 361/719 |
| 6,297,959 B1 | * | 10/2001 | Ueno et al. | 361/704 |
| 6,813,154 B2 | * | 11/2004 | Diaz et al. | 361/704 |
| 2005/0174740 A1 | * | 8/2005 | Hayakawa | 361/718 |
| 2006/0274500 A1 | * | 12/2006 | Nagayumi | 361/688 |

FOREIGN PATENT DOCUMENTS

DE    10123198 A1 *  5/2001

* cited by examiner

Primary Examiner—Michael Datskovskiy
(74) Attorney, Agent, or Firm—GrayRobinson, PA

(57) ABSTRACT

An apparatus for improved grounding and heat transfer between flange mount field effect transistors and printed wiring boards is provided comprising a cut-out formed in the printed wiring board, extending between its top and bottom surfaces, defining an edge which is covered or plated with a conductive material at least in some areas. One or more vias also extend between the top and bottom surfaces of the cut-out and are exposed along the edge. A field effect transistor is placed in the cut-out and into contact with a heat sink element designed to enhance grounding of the field effect transistor and improve the transfer of heat to the chassis or other metal support structure for the printed wiring board.

5 Claims, 2 Drawing Sheets

US 7,355,854 B2

APPARATUS FOR IMPROVED GROUNDING OF FLANGE MOUNT FIELD EFFECT TRANSISTORS TO PRINTED WIRING BOARDS

FIELD OF THE INVENTION

This invention relates to printed wiring boards, and, more particularly, to an apparatus for improved heat transfer and grounding of high frequency flange mount transistors to printed wiring boards.

BACKGROUND OF THE INVENTION

Printed wiring boards ("PWBs") are used in a wide variety of applications and may carry many different types of electrical components. One consideration in the fabrication of PWBs is how to effectively mount electrical components so they are properly grounded. Radio frequency ("RF") powered, flange mount field effect transistors ("FETs"), for example, are typically mounted to PWBs by forming a cut-out in the PWB so that the FET may be received within the cut-out and its flange may rest on the top surface of the PWB. In some designs, a heat sink boss extends from the floor of the chassis or other housing which carries the PWB into contact with the FET. These bosses are typically not connected in close proximity to the PWB ground, which increases the RF ground return path from the flange of the FET to the PWB.

It has been found that FETs tend to display gain and power degradation at higher frequencies, due to increased parasitic loss and mounting techniques of the type noted above. Additionally, the heat sink bosses employed, and the configuration of the cut-outs in the PWBs, provide less than effective heat transfer from the FET to the chassis or other metal structure in which the PWB is mounted.

SUMMARY OF THE INVENTION

This invention is directed to an apparatus for improved grounding and heat transfer between flange mount FETs and PWBs. A cut-out is formed in the PWB, extending between its top and bottom surfaces, defining an edge which is covered or plated with a conductive material at least in some areas. One or more vias also extend between the top and bottom surfaces of the cut-out and are exposed along its edge. An FET is placed in the cut-out and into contact with a heat sink element which is designed to enhance grounding of the FET and improve the transfer of heat to the chassis or other metal support structure for the PWB. Often times a copper strap or metal clip is placed between the flange of the FET device and the PWB ground plane, to further improve electrical conductivity.

In the presently preferred embodiment, the heat sink element comprises a base mounted to the chassis and a boss extending outwardly from the base. A shoulder is formed at the juncture of the base and boss. This shoulder contacts the edge of the cut-out in the PWB, one end of the vias and one end of the plating. The FET is secured to the boss by screws or other fasteners, and the PWB is mounted by fasteners to flanges formed on the base of the heat sink element. A separate copper strap or "ground aiding" device is no longer needed.

The combination of the heat sink element, the plating on the edge of the cut-out in selected areas and the vias exposed along the edge of the cut-out in the PWB substantially improves grounding of the FET compared to prior FET mounting techniques, and enhances the transfer of heat from the FET to the chassis or other metal support structure.

BRIEF DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
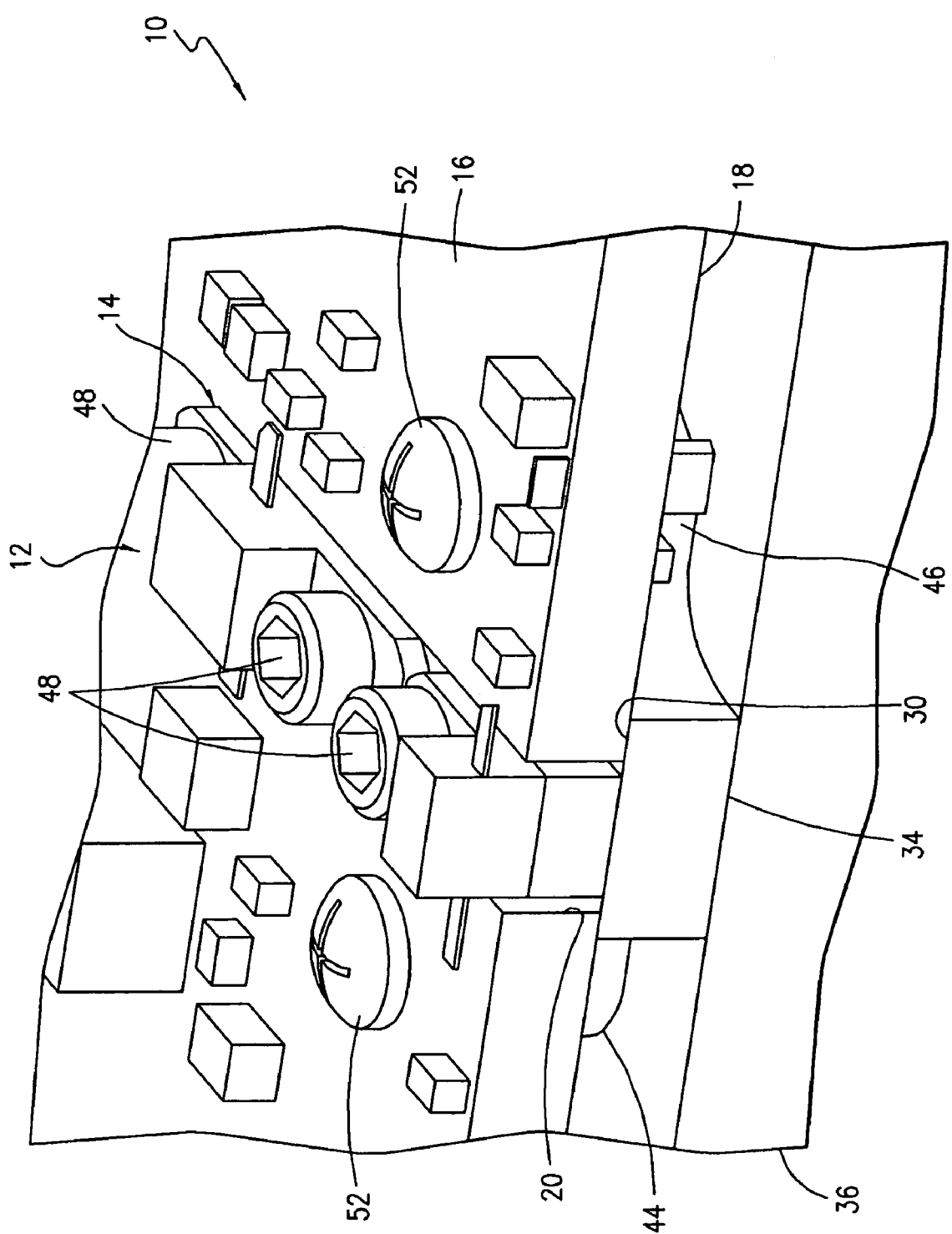
FIG. 1 is a perspective view, in partial cross section, of a PWB and FET including the heat sink element of this invention.
Figure 2:
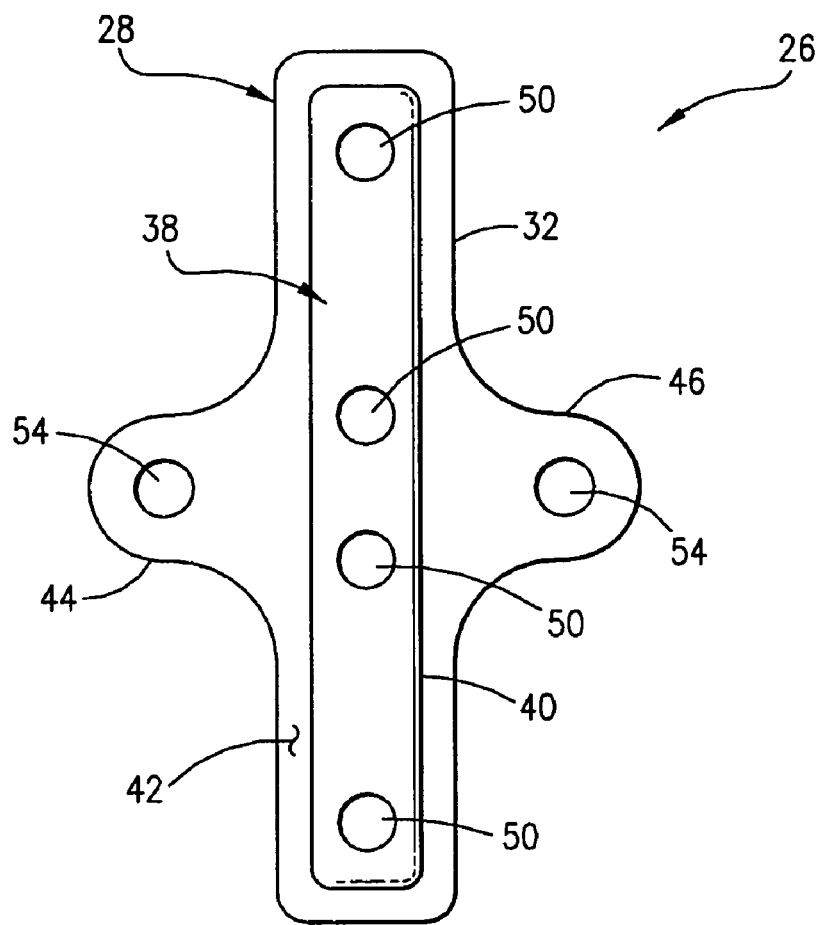
FIG. 2 is a plan view of the heat sink element herein.
Figure 3:
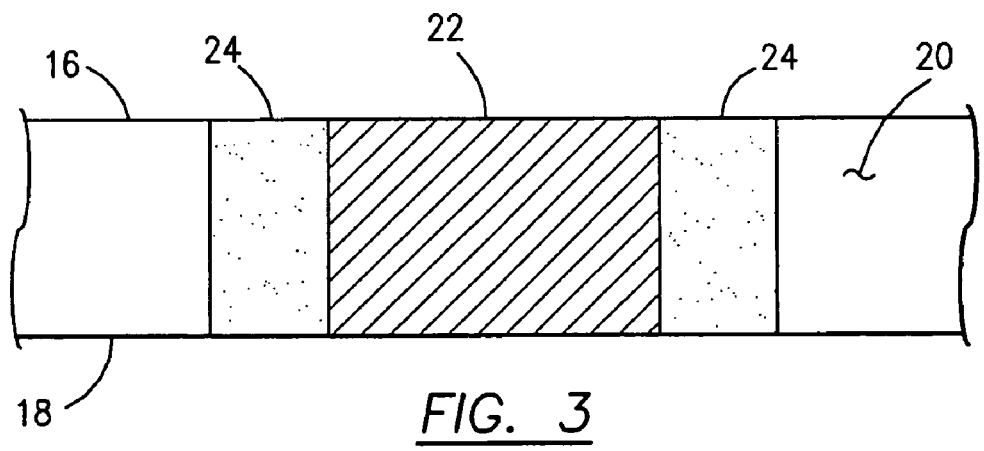
FIG. 3 is a partial, side view of the cut-out in the PWB showing the vias and plating along the edge of the cut-out.

Referring now to the Figures., a portion of a PWB 10 is shown coupled to a number of electrical components including a flange-mount FET 12. In order to mount the FET 12, the PWB 10 is formed with a cut-out 14 extending between the top surface 16 and bottom surface 18 of the PWB 10 defining an edge 20. For purposes of the present discussion, the terms "top," "bottom," "upper" and "lower" refer to the orientation of the PWB as it is depicted in the Figures. As best seen in FIG. 3, at least some areas 22 of the edge 20 of the cut-out 14 in the PWB 10 are covered or plated with a conductive material extending between the top and bottom surfaces 16, 18 of the PWB 10. The plating material may be any suitable metal capable of conducting and electrical charge and having thermally conductive properties. Additionally, one or more vias 24 are formed in the PWB between its top and bottom surfaces 16, 18 such that a portion of the vias 24 is exposed along the edge 20 of the cut-out 14. Each via 24 is filled with an electrically and thermally conductive material.

A heat sink element 26 is provided which comprises a base 28 including an upper surface 30 having a peripheral edge 32, and a lower surface 34 mounted to the chassis 36 of a structure (not shown) within which the PWB 10 is housed. The chassis 36 is made of metal and forms a heat sink floor for the transfer of heat, as described in more detail below. A boss 38 having a perimeter 40 extends upwardly from the upper surface 30 of the base 28 of heat sink element 26, forming a shoulder 42 in the space along the upper surface 30 of the base 28 between the perimeter 40 of the boss 38 and the peripheral edge 32 of the base 28. A pair of opposed flanges 44 and 46 extend from the base 28, in substantially the same plane as its upper surface 30.

The heat sink element 26 is positioned with respect to the PWB 10 such that the edge 20 of the cut-out 14 rests on the shoulder 42 of the heat sink element 26. Because the vias 24 and the plated areas 22 extend along the edge 20 of cut-out 14, they too contact the shoulder 42 of the heat sink element 26. The FET 12 received within the cut-out 14 of PWB 10 and is secured to the heat sink element 26 by screws 48 or other fasteners (only three of which are shown in the Figures.) extending into bores 50 formed in the boss 38. Similarly, the PWB 10 is connected to the heat sink element 26 with screws 52 threaded into holes 54 formed in each of the flanges 44, 46.

The close proximity of the plated areas 22 and vias 24 along the edge 20 of the cut-out 14 to the FET 12, and the shoulder 42 of the heat sink element 26, all contribute to improving the effective grounding area for the FET 12. This, in turn, improves gain and reduces power degradation at higher operating frequencies. Additionally, such construction enhances the transfer of heat from the FET to the chassis 36 along a thermal flow path defined by the plated areas 22 and vias 24 of the PWB 10, and the shoulder 42, boss 38 and base 28 of the heat sink element 26.

While the invention has been described with reference to a preferred embodiment, it should be understood by those skilled in the art that various changes may be made and equivalents substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. Apparatus for enhanced grounding of transistors, comprising:

a printed wiring board having a first surface, a second surface spaced from said first surface and at least one cut-out adapted to receive a transistor, said at least one cut-out extending between said first and second surfaces forming an edge which is at least partially covered with a conductive material, said printed wiring board being formed with a number of vias extending between said first and second surfaces, each of said vias being exposed along said edge of said cut-out; and a heat sink element comprising:
  (i) a base having a first surface adapted to connect to a heat sink floor and a second surface opposite said first surface, said second surface having a peripheral edge; and
  (ii) a boss extending outwardly from said second surface of said base, said boss having a perimeter, a shoulder being formed along said second surface of said base between said perimeter of said boss and said peripheral edge of said second surface, said edge of said cut-out and one end of said vias resting on said shoulder, said cut-out being adapted to receive a transistor which is adapted to mount to said boss.

2. The apparatus of claim 1 in which said base of said heat sink element is formed with opposed flanges, each of said flanges contacting said second surface of said printed wiring board and being connected to said printing wiring board by a fastener.

3. The apparatus of claim 1 in which said base and said boss of said heat sink element are formed of thermally conductive material.

4. The apparatus of claim 1 in which a flow path for the conduction of heat from the transistor to the heat sink floor is formed by said boss, said vias, and conductive material at least partially covering said edge of said cut-out and said base.

5. The apparatus of claim 1 in which said vias and said conductive material at least partially covering said edge of said cut-out provide a ground return path from a flange of the transistor to said printed wiring board.

* * * * *